United States Patent
Ribeiro

(10) Patent No.: US 6,690,579 B1
(45) Date of Patent: Feb. 10, 2004

(54) DOOR FOR COMPUTING APPARATUS

(75) Inventor: Durval S. Ribeiro, Owatonna, MN (US)

(73) Assignee: SPX Corporation, Charlotte, NC (US)

( * ) Notice: Subject to any disclaimer, the term of this patent is extended or adjusted under 35 U.S.C. 154(b) by 0 days.

(21) Appl. No.: 09/702,802

(22) Filed: Nov. 1, 2000

Related U.S. Application Data

(60) Provisional application No. 60/240,858, filed on Oct. 17, 2000.

(51) Int. Cl.[7] ................................................. H05K 7/00
(52) U.S. Cl. ........................ 361/728; 361/752; 361/801
(58) Field of Search ................................ 361/728, 730, 361/686, 929, 142, 146, 800, 801, 802, 752–755; 439/165, 521, 142, 144, 367, 519; 16/371

(56) References Cited

U.S. PATENT DOCUMENTS

| | | | | |
|---|---|---|---|---|
| 2,903,735 A | * | 9/1959 | Schneider | 16/229 |
| 3,728,757 A | * | 4/1973 | Lloyd | 16/303 |
| 4,478,005 A | * | 10/1984 | Mundschenk | 292/87 |
| 4,845,809 A | * | 7/1989 | Pillifant, Jr. | 16/259 |
| 5,199,888 A | * | 4/1993 | Condra et al. | 312/292 |
| 5,274,527 A | * | 12/1993 | Retzlaff | 200/43.08 |
| 5,278,993 A | * | 1/1994 | Reiff et al. | 455/575.3 |
| 5,507,072 A | * | 4/1996 | Youn | 16/261 |
| 5,568,358 A | * | 10/1996 | Nelson et al. | 361/681 |
| 5,678,206 A | * | 10/1997 | Ishii | 455/575.8 |
| 5,755,011 A | * | 5/1998 | Green et al. | 16/238 |
| 5,835,344 A | * | 11/1998 | Alexander | 206/320 |
| 5,884,947 A | * | 3/1999 | Lopez et al. | 292/198 |
| 5,924,170 A | | 7/1999 | Papke et al. | 16/321 |
| 5,992,028 A | | 11/1999 | Wing | 33/194 |
| 6,108,866 A | | 8/2000 | Waynick, Jr. | 16/82 |

* cited by examiner

*Primary Examiner*—Randy Gibson
*Assistant Examiner*—Thanh S. Phan
(74) *Attorney, Agent, or Firm*—Baker & Hosteler LLP

(57) ABSTRACT

A door detent mechanism for use with a computing apparatus that secures a door in one or more predetermined positions, and which can be used in a closed position as a secure door that covers a port, receptacle, pin, or other opening in the case of the computing apparatus to protect the interior of the computing apparatus from exposure to the environment, and which surmountably hinders rotation of the hinge of the door when the door reaches a predetermined degree of rotation of said hinge.

23 Claims, 3 Drawing Sheets

DOOR FOR COMPUTING APPARATUS

PRIORITY

This application claims priority from provisional patent application Serial No. 60/240,858 entitled, "Door Detent For Computing Apparatus," filed Oct. 17, 2000, the entire content of which is herein incorporated by reference.

FIELD OF THE INVENTION

The present invention relates generally to an apparatus for securing a door in a predetermined position. More particularly, the present invention relates to a door detent mechanism for use with a computing apparatus. The mechanism may be used to secure a door that covers a port, receptacle, pin, or other opening in the case of the computing apparatus to secure the door in an open, closed, or intermediate position.

BACKGROUND OF THE INVENTION

Computing devices, such as personal computers, main frames, lap top computers, pocket PCs, personal digital assistants, portable analog or digital analyzers, and the like generally include one or more ports or openings through which the computing device may be connected to another device or system. For example, a computer may include a power cord connector consisting of a plug that faces outward through an opening in the case of the computing apparatus. The user may connect a power cord from a power source to the computing apparatus via this connector. Similarly, modem jacks, network ports, or other openings through which a communication connection may be made may also be provided. Other interface ports, such as parallel interface ports, serial ports, or other input/output slots may be provided. Such ports or openings may include a pin connector that is designed to receive a cable containing pins or holes that correspond to the number and location of pins and holes on the pin connector. One end of the cable is connected to the pin connector, while the other end of the cable is connected to a peripheral device such as a mouse, a printer, a display, a modem, a disk drive, or other peripheral plug in device.

When peripheral devices are not connected to a computer apparatus through an input/output port, the port must be closed to prevent exposing the pin connector and/or other parts of the computer apparatus to the environment. Dust, moisture, other contaminants, or damaging objects may enter the computer apparatus from the environment through such a port. The potential for the entry of such substances is a particular problem with portable computing devices, such as digital analyzers, lap tops, and personal digital assistants.

To prevent loss or damage to the port or door mechanism, and to ensure its use, it is desirable therefore that the port covering or door remain connected to the computer apparatus when it is both open and closed and that it be easily operated. A number of different door or covering mechanisms have been developed for use in connection with portable computing apparatus such as lap top computers. These mechanisms typically involve the use of complex mechanisms utilizing a number of small parts including small springs.

While these mechanisms can be used on devices that are not subject to harsh environments and treatment, they would not be as useful on a device intended to be used in an environment such as an automobile shop where it is likely that the device will be dropped or hit with another tool.

There is thus still a need for a port covering or door mechanism which is easily operated, does not utilize any small parts, remains connected to the computing device, and is recessed into the device when the port is open.

SUMMARY OF THE INVENTION

The foregoing need has been satisfied to a great extent by the present invention which includes a door detent mechanism which is permanently affixed to a computer apparatus and which secures a door held in a closed or other position over an input/output port opening. In accordance with one embodiment of the invention, a computing apparatus has an opening. A door, sized and positioned to cover the opening, is connected to a hinge. The hinge includes two ends, and a pin is attached to each end of the hinge. Two receptacles, sized and positioned to accept the hinge, are attached to the computing apparatus. The hinge also includes at least one locking notch. At least one finger is attached to the computing apparatus in positions so that each locking notch on the hinge will engage with a finger when the door covers the opening in a closed position.

Preferably, the door and hinge are made of a plastic or synthetic material and include at least one groove that permits the door and hinge to be compressed for insertion of the pins into the receptacles. Preferably, the door or the hinge includes at least one rib extending away from the computing apparatus, the rib being sized and positioned to facilitate opening of the door by a human hand.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein as well as the abstract included below are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS OF THE INVENTION

Figure 1:
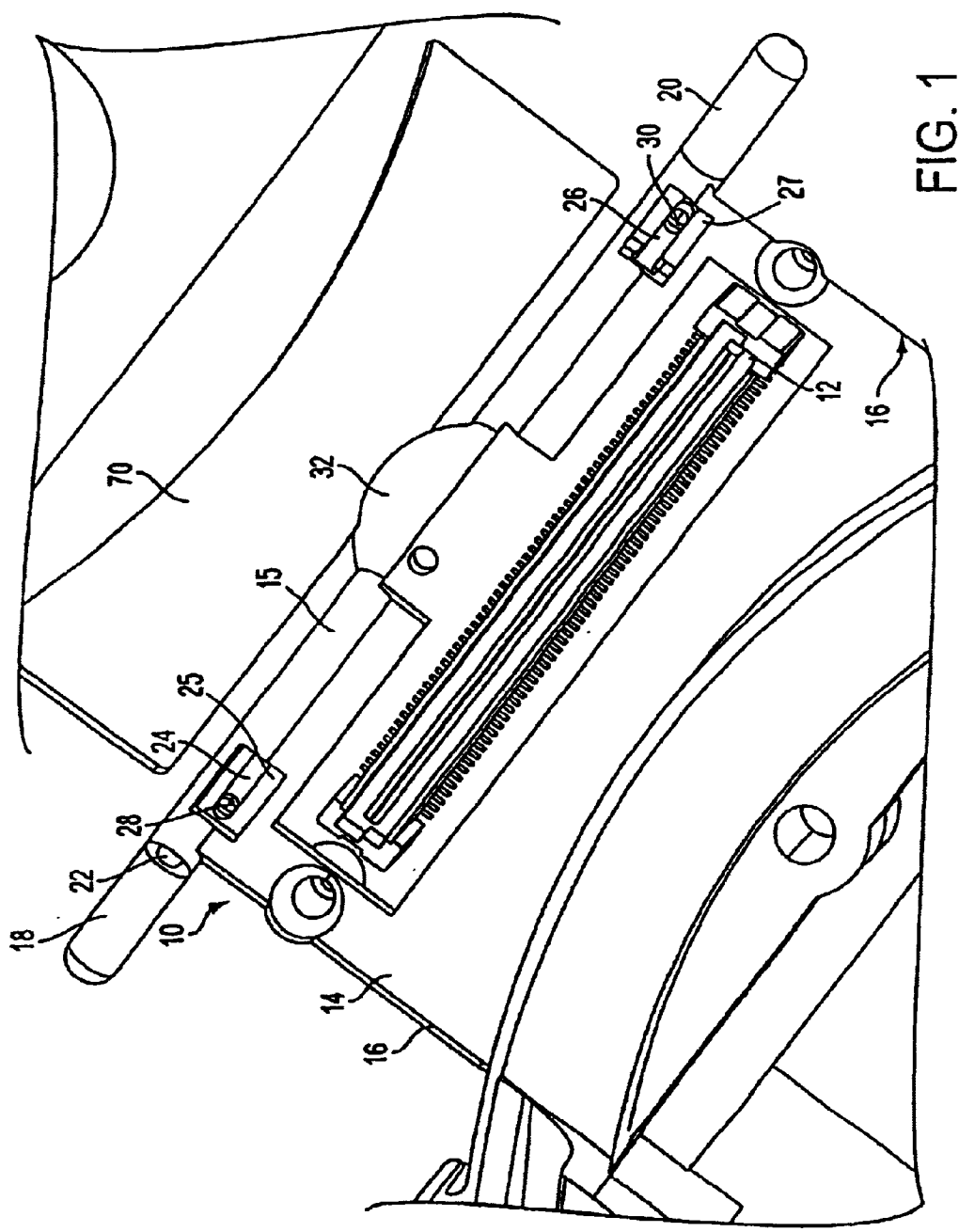
FIG. 1 is a perspective drawing of a computing apparatus incorporating components of a door in accordance with a preferred embodiment of the present invention.

Referring now to the figures, wherein like reference numerals indicate like elements, FIG. 1 there is shown a portion of computing apparatus 10 including a pin connector 12, a recessed area 14 formed by walls 16, and a first hinge 18 and a second hinge 20. As depicted, a receptacle 22 is provided in the first hinge. A receptacle (not shown), which is the same as the receptacle 22 of the first hinge 18, is also provided in the second hinge 20. Both hinges 18, 20 are located on opposite ends of a longitudinal groove 15 disposed at a longitudinal end of the recessed area 14.

Preferably, the receptacles 22 are cylindrical recesses having a cylindrical axis that is coincident with the axis of the hinge. The recess can have walls that are made of any solid material of sufficient smoothness and hardness to resist wear resulting from repetitive opening and closing of the door and consequent rubbing of the hinge pin against the receptacle. Suitable materials include, but are not limited to, plastics including polypropylene, PLEXIGLASS™, polyinethylmethacrylate, polyethylene, and the like, and materials such as steel or brass. For increased wear resistance, a coating, such as TEFLON™, can be applied to the inner wall of the receptacle 22. For ease of construction and reduced cost, preferred embodiments comprise receptacles that are molded into a portion of the computing apparatus 14, for example, by injection molding.

The computing apparatus 10 is also provided with two fingers 24, 26 which extend into openings 25 and 27 respectively. A portion of the openings 25, 27 may extend into a portion of the longitudinal groove 15 and the recessed area 14. Finger 24, 27 have spherical projections at their respective ends. As will be more readily understood in connection with subsequent figures, the fingers operate to maintain a door for covering the pin connector 12 in the open, closed, or partially open position. As will also be more readily understood in connection with subsequent figures, a recessed projection receiving area 32 may also be provided in a portion of the longitudinal groove 15 for receiving a projection used in opening and closing the door.

Figure 2:
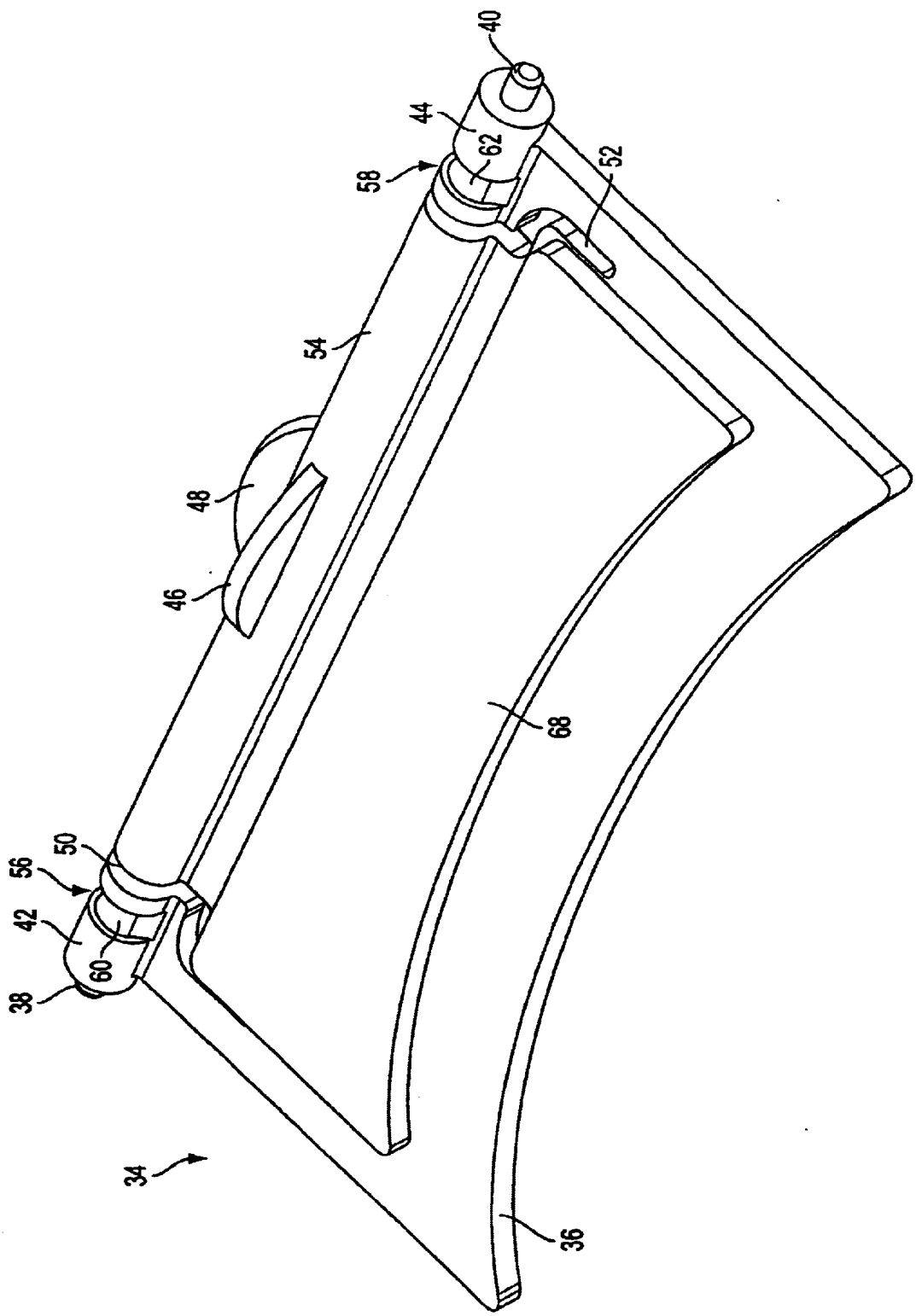
FIG. 2 is a perspective drawing of a door for use in connection with the computing apparatus of FIG. 1.

In FIG. 2 there is shown a door 34 for covering the pin connector 12 of FIG. 1. The door is shaped to fit into the recessed area 14 of the computing apparatus 10 and preferably has walls 36 with a thickness approximately equal to the depth of the walls 16 forming the recessed area 14 of the computing apparatus 10. The door is also provided with a first pin 38 and a second pin 40 at the end of a third hinge 42 and a fourth hinge 44, respectively. The first pin 38 is provided to fit into the receptacle 22 of the first hinge 18 on the computing apparatus 10. The second pin 40 is provided to fit into the second receptacle (not shown) of the second hinge 20. As will be readily understood, when the door is in place with the pins in the hinge receptacles, the door 34 will rotate on the pins.

In preferred embodiment, a first raised portion 46 and a second raised portion 48 are provided to facilitate opening and closing of the door. As will be more readily understood in connection with subsequent figures, an operator can grasp or push the raised portions 46, 38 to open or close the door 34. Such action may cause the raised portion 46,48 to be received within the recessed projection receiving area 32 in the computer apparatus 10. Many shapes, sizes, materials, surface textures, and positions upon the door are envisaged and fall within the scope of the present invention. For example, in preferred embodiments, one or more curved, rib-like projections having a longitudinal axis that is parallel to the axis of the hinge and having a vertical axis that passes substantially through the hinge axis are provided that efficiently transform a force that is perpendicular to the hinge axis into a rotation of the door about the hinge.

In the preferred embodiment grooves 50, 52 are provided to permit easy assembly of the hinge pins 38, 40 into their respective receptacles on the hinges 18, 20 of the computing apparatus 10. The grooves 50, 52 interrupt or divide the hinge region 54 of the door 34 thereby separating a portion of the hinge region 56, 58 adjacent to the hinge pins 38, 40 from the central portion of the hinge region 54. A slight and temporary deformation of the portions of the hinge regions 56, 58 adjacent the hinge pins 38, 40 relative to the central portion of the hinge region 54 thereby facilitates insertion of the hinge pins 38, 40 into their respective receptacles. The deformability of the hinge regions 56, 58 adjacent the hinge pins 38, 40 relative to the central portion of the hinge is predetermined by factors that include the length of the groove, the shape of the groove, and the stiffness of the material surrounding the groove. The groove must not completely separate the portion of the hinge regions 56, 58 adjacent to the hinge pins 38, 40 from the central portion of the hinge. An advantage of grooves 50, 52 is that the door can be easily installed and an operator can more easily remove and replace the door without risk of damage to the hinge pins or receptacles.

In certain applications, the risk of entry of environmental contaminants such as dust, moisture, other liquids such as solvents or oils, or corrosive gases, can be sufficiently high that it is desirable to minimize the extent to which the grooves 50, 52 lead to such exposure. It should be noted that this is accomplished in the present invention, for example, by providing an oblique or convoluted pathway for the grooves 50, 52 as they traverse the thickness of the hinge and door, thereby providing a longer, circuitous route for contaminants to traverse. Alternatively, the grooves 50, 52 can be sealed using a material, such as a silicone or other polymer, that is deformable and has a stiffness that is lower than that of the material of the w door or hinge adjacent to the groove.

The computing apparatus 10 and the door hinge are further adapted to provide the door detent positions of the present invention. In the preferred embodiment, at least one of the resiliently mounted fingers 24, 26 is positioned adjacent to the hinge region 54 of the door 34 and; engages a recessed portion 60, 62 in the hinge region 54. As will now be described in connection with FIG. 3, the fingers operate to engagedly hold the door 34 in a closed position, an open position, and any other desired partially open position.

Figure 3:
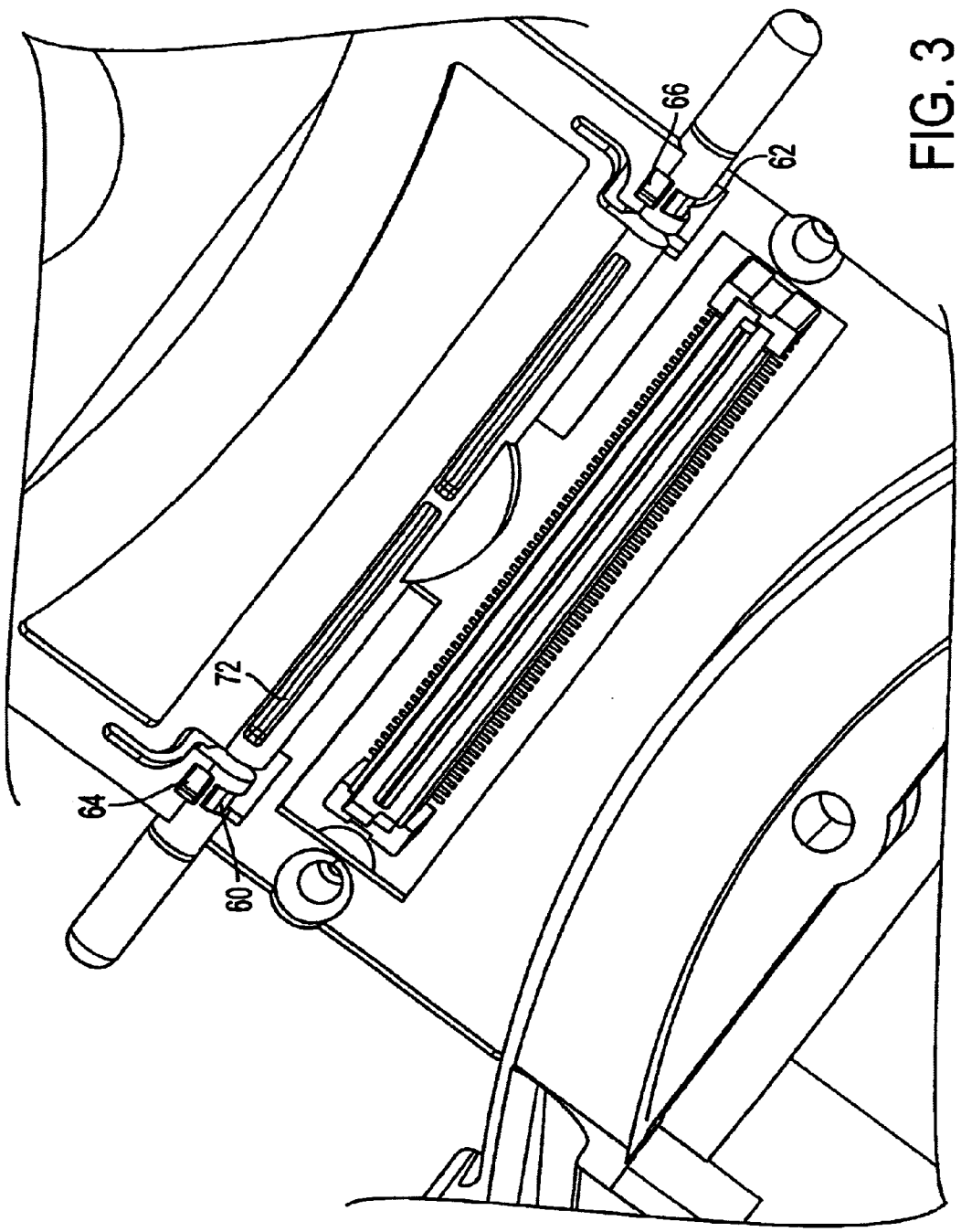
FIG. 3 is a perspective drawing of the computing apparatus of FIG. 1 with a door of FIG. 2 attached in the open position.

As shown in FIG. 3, the recessed portions 60, 62 are provided with notches 64, 66. When an operator intentionally applies a force to shut the door the spherical projections 28, 30 on the fingers 24, 26 (FIG. 1) are pushed out of the recessed portion 60, 62 of the hinge into the notches 64, 66 thereby providing an appropriate surmountable resistance to the reopening of the door 34. The surmountable resistance is preferably sufficient to prevent unintended reopening of the door 34 in normal use, while permitting an operator to intentionally open the door 34 without difficulty. Preferably, the pin is resiliently mounted upon the body of the computing apparatus.

In particular, the spherical projections 28, 30 are preferably rounded, and the notches 64, 66 are also rounded, so that upon rotation of the hinge, the notches 64, 66 expel the spherical portions 28, 30 of the fingers 24, 26. The fingers 24, 26 are made of a material, length, and cross-sectional area that provides sufficient rigidity that the fingers 24, 26 engage the notches 64, 66 firmly and are not unintentionally dislodged in normal use when the door is closed. Likewise, the rigidity of the cantilever of the fingers 24, 26 is not so great as to require an operator to apply an excessive opening force, which would cause rapid wear of the finger and/or notch, or result in premature fatigue fracture of the cantilever. Suitable materials for the spherical projections 28, 30 and fingers 24, 26 include rigid or semi-rigid plastics, metals such as steel or brass, or other non-brittle, resilient material. Preferably the cantilevered fingers 24, 26 and spherical projections 28, 30 are fabricated as integral parts of a portion of the body of the computing apparatus, for example by injection molding.

In order to provide a compact, hand-held computer device with the capability of providing multiple functionalities, it may be desirable to incorporate a pin connector corresponding to the pin connector 12 (FIG. 1) directly into the housing of a replaceable, function specific plug-in module that fits into the hand-held computer device. One such device is described in the co-pending U.S. patent application Ser. No. 09/702,750, entitled "Plug-In Module for Portable Computing Device," by Durval Ribeiro and Kurt Raichle, which is hereby incorporated herein by reference. When a peripheral device such as this is connected to the computer apparatus 10, the door 34 on the computer apparatus 10 would need to be stored in a recessed position to prevent the door from interfering with connection of the peripheral device.

Thus, in addition to the notches 64, 66 for maintaining the door in the closed position, additional notches may be provided in the recessed portions 60, 62 to provide additional detent positions for the door 34. In a preferred embodiment additional notches are at least provided at a position in the recessed portions 60, 62 to maintain the door in a fully open position with the raised portion 48 of the door 34 resting within a recessed area 70 of the computing apparatus 10. By appropriate positioning of the notch about the rotational axis of the hinge, any detent position between fully open and fully closed is achieved.

In the preferred embodiment, the pin connector 12 is positioned within the computing apparatus 10 below the recessed area 14 surface. This recessed area 14 surface is preferably planar and oriented to contact a portion of the door 34 when the door is in a closed position. Entry of environmental hazards, such as dirt, liquids, or mechanically damaging objects, is thereby prevented or hindered. However, it should be noted that planarity of the surface of the computing apparatus that contacts a surface of the door, while preferred, is not required. Thus, any shape of the surface that contacts the door is permitted within the scope of the present invention, provided that complementary portions of the two surfaces can be smoothly brought into contact by simple rotation of the door 34 about the axis of the hinge pins 38, 40.

As depicted in FIG. 3, the circumference of the hinge that contacts or is immediately adjacent to a finger 24, 26 and includes the notch 64, 66 can be contoured to provide a cam shape. The cam profile provides the "action" or tactile response of the door to opening and closing, which is advantageous to an operator. Thus, a cam profile that progressively increases to a maximum height (relative to the axis of the hinge) as the door is shut, provides to the operator a steadily increasing resistance as the force of the finger upon the cam increases. This resistance ends when the door is shut and finger engages the recess. Therefore, in the preferred embodiment the cam profile is selected to provide a desired relationship between the degree of opening of the door and the resistance felt by an operator.

Optionally, the hinged area is provided with at least one lateral groove 72 disposed upon an axis that is parallel to the axis of the hinge. This lateral groove is provided to avoid shrink problems with the plastic material.

Alternatively, and still within the scope of the present invention, other hinge attaching means are also envisaged. For example, the receptacle can further comprise a spring or spring-like resilient material such as an elastomer that provides a lateral force upon the hinge along the axis of the hinge, thereby more securely holding the hinge and door in position. In a second example, the receptacle and pin can be reversed so that the receptacle is attached to the respective ends of the hinge, while the pins are attached to the body of the computing apparatus in positions to accept the hinge. Other means of operably connecting the hinge to the body of the computing apparatus that do not require pins and receptacles are known to those of skill in the art, and also fall within the scope of the present invention. For example, a thin metal rod can be inserted through an axial cavity coincident with the hinge axis and extending into each side of the body of the computing apparatus so that the rod is securely held and the hinge rotates about it.

Other door detent means within the scope of the present invention will be readily envisaged by one of ordinary skill in the art. Any means whereby the door is held in a predetermined position by a mechanism in which rotation of the hinge is impeded by mechanically interposing an object into the rotational path of a portion of the hinge is envisaged as within the scope of the present invention. For example, the hinge is optionally provided with a projection that contacts a retractable structure attached to the body of the computing apparatus, thereby hindering rotation of the hinge when the door is shut.

The above description and drawings are only illustrative of preferred embodiments which achieve the objects, features, and advantages of the present invention, and it is not intended that the present invention be limited thereto. Any modification of the present invention which comes within the spirit and scope of the following claims is considered to be part of the present invention.

What is claimed is:

1. A method of opening and closing a door of a computer apparatus, comprising:

grasping a projection extending from a longitudinal side end of the door of the computer apparatus, when the door is in a closed position;

pushing said projection such that the door rotates in an axis of rotation around said side end of the door;

moving a finger, disposed in the computer apparatus, with a spherical projection at an end thereof, in a recessed portion adjacent a hinge area of the door during the rotational movement of the door; and inserting the spherical projection of said finger into a notch disposed in said recessed portion such that the door is held in an open position.

2. The method according to claim 1, further comprising:

moving the door from said open position such that said spherical projection is released from said recessed portion;

moving said spherical projection of said finger within said recessed portion during the rotational movement of the door; and closing the door such that the door is disposed in a recessed area within the computer apparatus.

3. A system for covering an input/output port opening of a computer apparatus and retaining a door in a detent position comprising:

a recessed area formed within the computer apparatus in which the door is disposed in a closed position, said recessed area having a longitudinal groove disposed at and generally spanning a longitudinal end of said recessed area;

a first hinge disposed on the computer apparatus adjacent one end of said longitudinal groove; and a second hinge disposed on the computer apparatus adjacent the other end of said longitudinal groove; and a door for covering the input/output port opening.

4. The system of claim 3, wherein each of the first and second hinges further comprise:

a receptacle for receiving a pin disposed on third and fourth hinges of the door to connect said door to the computer apparatus.

5. The system of claim 4, wherein the receptacle is a cylindrical recess having a cylindrical axis coincident with an axis of the first and second rotatable hinges.

6. The system of claim 5, wherein the cylindrical recess further includes walls made of one of a plastic and a metal material.

7. The system of claim 5, wherein the receptacle further includes an inner wall having a coating applied to prevent wear.

8. The system according to claim 4, wherein at least a portion of an opening is disposed in each end of the longitudinal groove, and a finger is provided in said opening.

9. The system of claim 8, wherein the finger includes a spherical projection which extends from an end of said finger within the opening.

10. The system of claim 9, wherein recessed portions are provided on the door, said recessed portions further including a notch disposed adjacent to the third and fourth door hinges, and the spherical projection engaging said notch to hold the door in an open position.

11. The system of claim 10, wherein a groove is disclosed adjacent to the recessed portions on the door, said groove allowing the pin disposed on the third and fourth hinges to deflect toward one another in order connect into the receptacle of the first and second hinges.

12. The system of claim 11, wherein the notch further includes a cam and the spherical projection of the finger moves along a surface of the cam.

13. The system of claim 9, wherein the finger is a cantilever.

14. The system of claim 13, wherein the finger and the spherical projection are formed from a plastic and are further integral with the body of the computer apparatus.

15. The system of claim 3, wherein the door includes a projection disposed on a surface along a side end of the door, wherein said projection causes the door to open when pushed.

16. The system of claim 15, wherein said projection is substantially planar and has a longitudinal axis parallel to an axis of said first rotatable and second rotatable hinge and a vertical axis that passes substantially through said longitudinal axis.

17. A system for covering an input/output port opening of a computing apparatus and retaining a door in a detent position comprising:

a recessed area formed within the computer apparatus in which the door is disposed in a closed position, said recessed area having a longitudinal groove disposed at and generally spanning a longitudinal end of said recessed area;

a first and second securing means provided with the computer apparatus;

a third and fourth securing means provided with the door;

means for attaching said first and second securing means to said third and fourth securing means respectively;

means for deflecting the third and fourth securing means toward one another in order to attach the door to the first and second securing means respectively;

a finger disposed in an opening in the computer apparatus, said finger having a spherical projection which extends from one end of said finger; and a recessed portion provided with a notch which is disposed adjacent said third and fourth securing means wherein said spherical projection engages said notch to hold the door in an open position.

18. The system of claim 17, wherein said first and second securing means comprises:

a first and second hinge respectively.

19. The system of claim 18, wherein said third and fourth securing means comprises:

a third and fourth hinge respectively.

20. The system of claim 19, wherein said means for attaching comprises:

a pin disposed on the third and fourth hinges.

21. The system of claim 20, further comprising:

a receptacle disposed on the first and second hinge, said receptacle receiving the pin disposed on the third and fourth hinges respectively.

22. The system of claim 21, wherein said means for deflecting comprises:

a groove disposed on the door adjacent to the third and fourth hinges, said groove facilitating the pins to deflect toward one another in order to be inserted within their respective receptacles.

23. A system for covering an input/output port opening of a computing apparatus and retaining a door in a detent position comprising:

a recessed area formed within the computer apparatus in which the door is disposed in a closed position, said recessed area having a longitudinal groove disposed at and generally spanning a longitudinal end of said recessed area;

a first and second securing means provided with the computer apparatus;

a third and fourth securing means provided with the door;

means for attaching said first and second securing means to said third and fourth securing means respectively;

means for deflecting the third and fourth securing means toward one another in order to attach the door to the first and second securing means respectively; and means for holding the door in an open position.

* * * * *